United States Patent
You

(10) Patent No.: US 10,734,962 B2
(45) Date of Patent: *Aug. 4, 2020

(54) LOUDNESS-BASED AUDIO-SIGNAL COMPENSATION

(71) Applicant: Guoguang Electric Company Limited, Guangzhou (CN)

(72) Inventor: Yuli You, Laguna Beach, CA (US)

(73) Assignee: Guoguang Electric Company Limited, Guangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/405,712

(22) Filed: May 7, 2019

(65) Prior Publication Data

US 2019/0267959 A1    Aug. 29, 2019

Related U.S. Application Data

(63) Continuation of application No. 15/964,683, filed on Apr. 27, 2018, now Pat. No. 10,333,483, which is a
(Continued)

(51) Int. Cl.
*H03G 3/32* (2006.01)
*H03G 7/00* (2006.01)
(Continued)

(52) U.S. Cl.
CPC ............ *H03G 3/32* (2013.01); *H03G 7/008* (2013.01); *H03G 9/025* (2013.01); *H04R 3/04* (2013.01)

(58) Field of Classification Search
CPC .. H03G 3/00; H03G 3/32; H03G 7/00; H03G 7/008; H03G 9/025; H03G 3/20;
(Continued)

(56) References Cited

U.S. PATENT DOCUMENTS

| 4,168,508 A | 9/1979 | Gilbert |
| 4,214,503 A | 7/1980 | Deutsch |

(Continued)

FOREIGN PATENT DOCUMENTS

| EP | 2395659 A2 | 12/2011 |
| WO | WO2012116934 A1 | 9/2012 |

OTHER PUBLICATIONS

Prasad, Pradeep D., "A Low Complexity approach for Loudness Compensation", Audio Engineering Society (AES) 129th Convention, San Francisco, CA, USA, Nov. 4-7, 2010, Paper No. 8263, Nov. 4, 2010.

(Continued)

*Primary Examiner* — Gerald Gauthier
(74) *Attorney, Agent, or Firm* — Joseph G Swan, PC

(57) ABSTRACT

Provided are, among other things, systems, methods and techniques for loudness-based audio-signal compensation. According to one such system, an input line accepts an input audio signal; a loudness estimator, coupled to the input line, processes the input audio signal to obtain an audio playback loudness level and also provides a production loudness level for the input audio signal; and a filter generator/selector coupled to an output of the loudness estimator provides an audio compensation filter based on the production loudness level and the audio playback loudness level. The input signal is processed by the audio compensation filter to provide an output signal.

30 Claims, 6 Drawing Sheets

Related U.S. Application Data continuation of application No. 15/414,742, filed on Jan. 25, 2017, now Pat. No. 9,985,595, which is a continuation of application No. 14/852,576, filed on Sep. 13, 2015, now Pat. No. 9,590,580.

(51) Int. Cl.
*H03G 9/02* (2006.01)
*H04R 3/04* (2006.01)

(58) Field of Classification Search
CPC .. H04R 1/10; H04R 3/04; G10L 21/00; G10L 25/84
USPC ......... 381/17, 28, 57, 58, 99, 103, 104, 107, 381/303, 309, 56; 704/211
See application file for complete search history.

(56) References Cited

U.S. PATENT DOCUMENTS

| | | | |
|---|---|---|---|
| 4,490,843 A | 12/1984 | Bose et al. | |
| 5,492,129 A | 2/1996 | Greenberger | |
| 7,002,069 B2 | 2/2006 | Desai et al. | |
| 7,016,509 B1 | 3/2006 | Bharitkar et al. | |
| 7,046,812 B1 | 5/2006 | Kochanski et al. | |
| 7,058,188 B1* | 6/2006 | Allred | H03G 5/18 381/103 |
| 8,019,095 B2 | 9/2011 | Seefeldt et al. | |
| 8,054,993 B1 | 11/2011 | Kreifeldt et al. | |
| 8,090,120 B2 | 1/2012 | Seefeldt | |
| 8,144,881 B2 | 3/2012 | Crockett et al. | |
| 8,170,228 B2 | 5/2012 | Goldstein et al. | |
| 8,194,889 B2 | 6/2012 | Seefeldt | |
| 8,199,933 B2 | 6/2012 | Seefeldt | |
| 8,213,624 B2 | 7/2012 | Seefeldt | |
| 8,428,270 B2 | 4/2013 | Crockett et al. | |
| 8,428,743 B2 | 4/2013 | Kals et al. | |
| 8,488,809 B2 | 7/2013 | Seefeldt | |
| 8,600,074 B2 | 12/2013 | Seefeldt et al. | |
| 8,731,215 B2 | 5/2014 | Seefeldt et al. | |
| 9,319,789 B1 | 4/2016 | Nielsen | |
| 9,361,901 B2 | 6/2016 | LeBlanc et al. | |
| 9,431,982 B1* | 8/2016 | Yang | H03G 3/20 |
| 9,559,650 B1 | 1/2017 | Skovenborg et al. | |
| 9,565,508 B1* | 2/2017 | Skovenborg | H04S 3/006 |
| 9,590,580 B1* | 3/2017 | You | H03G 7/008 |
| 9,830,924 B1* | 11/2017 | Degges, Jr. | G10L 21/00 |
| 10,158,960 B1 | 12/2018 | Moller | |
| 10,355,658 B1* | 7/2019 | Yang | H04R 3/00 |
| 2004/0022400 A1 | 2/2004 | Magrath | |
| 2004/0143433 A1 | 7/2004 | Marumoto et al. | |
| 2004/0218514 A1 | 11/2004 | Ieda et al. | |
| 2004/0240684 A1* | 12/2004 | Cerasuolo | H03G 5/165 381/104 |
| 2005/0013443 A1 | 1/2005 | Marumoto et al. | |
| 2005/0058303 A1 | 3/2005 | Martin et al. | |
| 2005/0100173 A1 | 5/2005 | Eid et al. | |
| 2005/0135643 A1* | 6/2005 | Lee | H04S 7/301 381/309 |
| 2005/0195994 A1 | 9/2005 | Saito et al. | |
| 2006/0281403 A1 | 12/2006 | Richards et al. | |
| 2007/0078647 A1 | 4/2007 | Pavlov et al. | |
| 2008/0039964 A1 | 2/2008 | Charoenruengkit et al. | |
| 2008/0095385 A1* | 4/2008 | Tourwe | H03G 7/007 381/107 |
| 2008/0177532 A1 | 7/2008 | Greiss et al. | |
| 2008/0267427 A1 | 10/2008 | Johnston | |
| 2009/0074209 A1 | 3/2009 | Thompson et al. | |
| 2009/0122997 A1 | 5/2009 | Okumura | |
| 2009/0161883 A1* | 6/2009 | Katsianos | H04S 7/00 381/57 |
| 2010/0005953 A1 | 1/2010 | Kemmochi et al. | |
| 2010/0158273 A1 | 6/2010 | Cheah et al. | |
| 2011/0038490 A1* | 2/2011 | Yang | H03G 5/165 381/103 |
| 2011/0064258 A1 | 3/2011 | Aggarwal et al. | |
| 2011/0081024 A1 | 4/2011 | Soulodre | |
| 2011/0222695 A1* | 9/2011 | Hess | H03G 3/32 381/56 |
| 2011/0305346 A1* | 12/2011 | Daubigny | H03G 3/32 381/28 |
| 2012/0063616 A1* | 3/2012 | Walsh | H03G 5/025 381/103 |
| 2012/0209602 A1 | 8/2012 | Naylor | |
| 2012/0221326 A1 | 8/2012 | Grancharov et al. | |
| 2012/0310654 A1 | 12/2012 | Riedmiller et al. | |
| 2013/0148822 A1 | 6/2013 | Bithell et al. | |
| 2013/0272543 A1* | 10/2013 | Tracey | H03G 5/005 381/107 |
| 2013/0305152 A1 | 11/2013 | Griffiths et al. | |
| 2014/0016791 A1* | 1/2014 | Smith | H03G 9/025 381/57 |
| 2014/0037108 A1 | 2/2014 | Christoph | |
| 2014/0046464 A1 | 2/2014 | Reimann | |
| 2014/0093096 A1 | 4/2014 | Sheen et al. | |
| 2014/0177871 A1* | 6/2014 | Morton | H04R 3/04 381/99 |
| 2014/0321670 A1* | 10/2014 | Nystrom | H04S 7/307 381/107 |
| 2014/0328500 A1* | 11/2014 | Patwardhan | H03G 5/16 381/107 |
| 2015/0003625 A1 | 1/2015 | Uhle et al. | |
| 2015/0036842 A1 | 2/2015 | Robinson | |
| 2015/0063573 A1* | 3/2015 | Daly | H03G 5/00 381/17 |
| 2015/0085441 A1 | 3/2015 | Reilly et al. | |
| 2015/0125016 A1 | 5/2015 | De Vries et al. | |
| 2015/0131826 A1* | 5/2015 | Bahne | H04S 7/307 381/303 |
| 2015/0156588 A1 | 6/2015 | Kyriakakis et al. | |
| 2015/0170657 A1 | 6/2015 | Thompson et al. | |
| 2015/0207479 A1* | 7/2015 | Baumgarte | H03G 9/025 704/211 |
| 2015/0208184 A1* | 7/2015 | Tan | H04R 3/04 381/58 |
| 2015/0264509 A1 | 9/2015 | Oishi et al. | |
| 2015/0281864 A1 | 10/2015 | Song et al. | |
| 2015/0325243 A1 | 11/2015 | Grant et al. | |
| 2015/0348564 A1 | 12/2015 | Paulus et al. | |
| 2015/0358730 A1 | 12/2015 | Kirsch et al. | |
| 2016/0011848 A1 | 1/2016 | Wilberding et al. | |
| 2016/0043699 A1 | 2/2016 | Sawa et al. | |
| 2016/0066114 A1* | 3/2016 | Skovenborg | H03G 3/3005 381/56 |
| 2016/0087597 A1 | 3/2016 | Barker et al. | |
| 2016/0192071 A1 | 6/2016 | Nakamura | |
| 2016/0253049 A1 | 9/2016 | Wild et al. | |
| 2016/0261953 A1* | 9/2016 | Aggarwal | H03G 3/32 |
| 2017/0048609 A1* | 2/2017 | Schnell | H04R 1/1083 |
| 2017/0053666 A1* | 2/2017 | Konjeti | H03G 3/342 |
| 2017/0155369 A1* | 6/2017 | Wang | G10L 21/0364 |

OTHER PUBLICATIONS

Jim Coates, "ALE Starter Guide", Texas Instruments, Application Report SLEA014, May 2003.
R. S. Stroud, "Loudness Compensation in Automobiles," SAE International, Paper No. 2009-01-0958, 2009.
"Normal equal-loudness-level contours Acoustics", ISO 226:2003(E) International Standard, Technical Committee ISO/TC 43, Acoustics, ISO, 2003, Third edition dated Mar. 2011, with changes from the Second edition highlighted.
Prosecution history of parent U.S. Appl. No. 14/852,576 (now U.S. Pat. No. 9,590,580).
Prosecution history of parent U.S. Appl. No. 15/414,742 (U.S. Pat. No. 9,985,595).
Partial European Search Report dated Feb. 15, 2017, in corresponding European Patent Application No. 16 179 892.1.
European Search Report dated May 30, 2017, in corresponding European Patent Application No. 16 179 892.1.
Office Action dated Nov. 1, 2017, in corresponding Chinese patent application No. 201610398579.0.

(56) References Cited

OTHER PUBLICATIONS

Prosecution history of, including prior art cited in, parent U.S. Appl. No. 15/964,683, filed Apr. 27, 2018.
Office Action issued by the Japanese Patent Office dated Nov. 8, 2018 in corresponding Japanese Patent Application No. 2016-177112.

* cited by examiner

LOUDNESS-BASED AUDIO-SIGNAL COMPENSATION

FIELD OF THE INVENTION

The present invention pertains, among other things, to systems, methods and techniques for audio-signal processing, and particularly applies to processing and/or compensation to accommodate different levels of audio volume (or loudness).

BACKGROUND

Typically, an audio signal is produced (e.g., recorded) at a certain volume level, but then is played back at a different volume level. Unfortunately, this situation frequently poses a problem for perceived audio quality, due to the nonuniformity of human loudness perception. Specifically, sensitivity of the human auditory system varies with frequency and volume. For example, when watching a movie at low volume late at night, one might notice that the movie sound is reduced mainly or solely to dialogue, while other (e.g., background) sounds, such as footsteps, become inaudible. This happens because the human auditory system is not very sensitive to particularly low or high frequencies, and the severity of this reduction in sensitivity gets worse at low playback volumes.

It is, therefore, desirable to adaptively compensate for the perceived differences in volumes of sound components at any playback level in such a way that the perceived relative loudnesses of such components is unchanged even if the playback volume is changed. In the example above, this means that background sounds, such as footsteps, will be heard as equally loud compared to the dialogue at any playback level.

The idea of loudness compensation may be traced back to the 1930s. The 1935 Grunow "Tombstone" table radio receiver used analog circuitry to produce a loudness compensation frequency response curve that 1) boosts the bass strongly and treble weakly, and 2) varies with the playback volume set by the user. This circuitry essentially solidified the basic principle of loudness compensation: bass and treble boost that varies with the playback volume set by the user (i.e., the position of the playback device's volume knob).

Modern loudness compensation technologies are not very different, except that digital dynamic equalizers, shelf filters in particular, are deployed to enable an audio engineer to fine-tune the frequency range and level of boost to the ear's liking. This fine-tuning is usually done for a couple of playback levels and then interpolation is used to accommodate other playback levels.

SUMMARY OF THE INVENTION

The foregoing approaches and similar approaches in the prior art employ coarse and empirical approximations to the mechanism of human loudness perception. The preferred embodiments of the present invention, on the other hand, typically provide compensation filters that more closely approximate ideal loudness-compensation contours without requiring strenuous fine-tuning.

Thus, one embodiment of the invention is directed to a system for loudness-based audio-signal compensation. An input line accepts an input audio signal; a loudness estimator, coupled to the input line, processes the input audio signal to obtain an audio playback loudness level and also provides a production loudness level for the input audio signal; and a filter generator/selector coupled to an output of the loudness estimator provides an audio compensation filter based on the production loudness level and the audio playback loudness level. The input signal is processed by the audio compensation filter to provide an output signal.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

DESCRIPTION OF THE PREFERRED EMBODIMENT(S)

For ease of reference, certain portions of the present disclosure are divided into sections. The general subject matter of each section is indicated by that section's heading.

Figure 1:
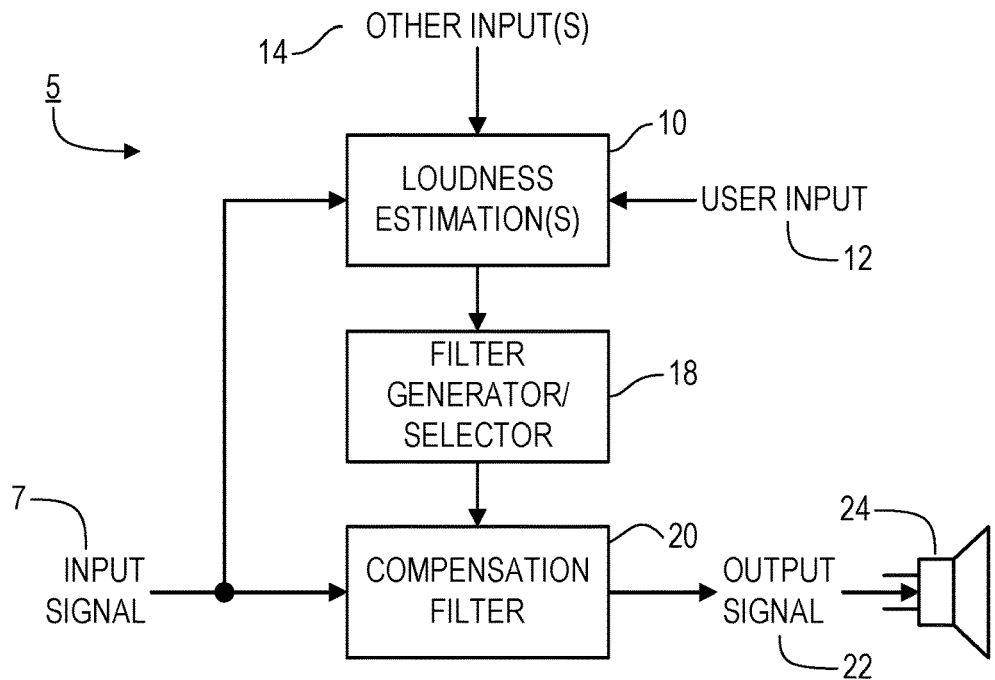
FIG. 1 is a simplified block diagram of an audio compensation system according to a representative embodiment of the present invention.

The general configuration of a system 5 for audio compensation according to the preferred embodiments of the present invention is shown in FIG. 1. As discussed in greater detail below, one of the goals of system 5 is to provide differential gains for different frequency components of an audio signal, using a frequency-dependent gain profile that varies depending upon how loudly the audio signal is being played back, particularly in relation to a volume at which the original audio signal had been generated (e.g., recorded onto a physical medium).

In this regard, an input audio signal 7 typically will have been retrieved from a storage medium (e.g., optical disk, solid-state device or magnetic medium) for the purposes of playback, and the particular embodiments discussed herein generally contemplate such a situation. However, input audio signal 7 instead might have been received from a local source via any type of connection and/or from a remote source across any type of communication channel (in either case, e.g., using one or more direct wireless and/or hardwired connections and/or networks, such as the Internet, involving one or more forwarding nodes) for immediate playback. In any event, input signal 7 often will have been subjected to some preprocessing (for any of a variety of different purposes) prior to being input into system 5. Also, depending upon the particular embodiment, system 5 can function independently or can be part of a larger system (typically, an audio playback system).

The original audio signal to which signal 7 corresponds typically will have been generated at one volume level, but the end user wishes to play it back at a different volume level. However, as discussed in greater detail elsewhere herein, human perception of the audio spectrum varies based on loudness (or volume), so that an audio signal (which often includes one or more sounds), e.g., that had been produced (e.g., recorded) so as to be "optimal" in some sense to a listener at a first volume level generally will not have the same qualities at a second volume. For example, certain discrete sounds might be perceived as being too quiet (or even completely imperceptible) or else too loud at the second volume level, and/or even individual sounds that are comprised of multiple frequency components might be perceived in a manner that is distorted from "optimal" at the second volume level. One of the goals of the present invention, therefore, is to provide systems, methods and techniques to compensate for these perceptual differences by applying a loudness-based differential gain profile to the frequency spectrum of an audio signal that is to be played back.

For this purpose, it typically is desirable to identify or estimate a production loudness level, e.g., at which the original audio signal was produced (e.g., recorded), and a playback loudness level at which the end user actually is playing or intends to play the audio signal. However, as discussed in greater detail below, it should be noted that such estimations (particularly with respect to the production loudness level) need not be estimations of the actual values, but instead could be estimations of values intended to produce an effect that is subjectively desired by the listener.

In the current embodiments, such estimations are performed in processing block 10. Specific embodiments of loudness estimator 10 are discussed in greater detail below, and, as indicated, each has its own unique combination of benefits. However, generally speaking, in the various embodiments, loudness estimator 10 can use any of a variety of different inputs, such as the input signal 7 itself, user input 12 and/or various other input(s) 14. In the various embodiments, input signal 7 can be processed within loudness estimator 10 to estimate instantaneous playback loudness levels and/or, using specified assumptions (e.g., regarding gains in the original audio-signal-generation system and/or the subsequent transmission, storage and/or playback system) and/or calibration information, to estimate the production loudness level(s).

Depending upon the particular embodiment, the user input 12 can include any of a variety of different signals provided (e.g., manually) by, or otherwise generated in response to actions (e.g., voice commands or gestures) undertaken by, the user. Such user input 12 can include, e.g., any or all of: the volume level selected by the end user via the playback device's user interface, a selection of a value corresponding to the production loudness level, selection of a value representing the difference between the production loudness level and the playback loudness level, and/or a selection of one or more values representing or corresponding to any other factor affecting playback loudness (such as room acoustics, speaker or headphone sensitivity, number or layout of speakers, and/or listener distance from the speakers). These user input signal(s) 12, if provided, typically reflect at least one manual setting made by the user.

In contrast, the other input(s) 14, if provided, typically will be generated automatically and/or received from some other source (e.g., as metadata along with the input signal 7, such as metadata indicating the production loudness level, either instantaneous or overall for a particular relatively large piece of audio content, such as an entire song or audio track) and might reflect, e.g., some aspect of: the original audio signal generation, the original audio signal storage or transmission process and/or media, and/or the overall audio playback system (e.g., room acoustics and/or headphone characteristics). For instance, the other input(s) 14 can include detected characteristics of the amplifiers in the playback device and/or metadata provided by the originator of the audio signal. Also, in some embodiments, the playback device automatically detects the type of headphone being used (e.g., for a USB or Bluetooth headset) and retrieves a previously stored value indicative of the headphone's sensitivity and/or current volume setting), which is then used as one or more of the other input(s) 14. Still further, in some embodiments, a calibration procedure can be performed by the playback device in which a reference audio signal is played through the playback system's speaker(s), and a microphone with known characteristics is positioned (e.g., where the listener(s) are intended to be), in order to detect one or more measures of the overall gain from the input to the speaker(s) to the sound pressure level that is likely to be encountered by the listener(s) (thus reflecting a combination of speaker sensitivity and room acoustics), which measure(s) can then be stored and later provided as other input(s) 14.

In any event, based on the (e.g., received and/or internally generated) information, estimation module 10 preferably generates estimates of at least the production loudness and the playback loudness. Either or both of these values can be static for the entire duration of a particular piece of audio (e.g., a song, an album of songs, a video soundtrack, or a music or other audio file), can be estimated dynamically at fixed temporal intervals (e.g., of anywhere from 10 milliseconds (ms) to 10 seconds) or variable temporal intervals (e.g., intervals having consistent audio properties), and/or can be altered when desired by the listener, depending upon the particular embodiment.

In the embodiments discussed below, sometimes only a subset of the various inputs 7, 10 and 12 are discussed and/or illustrated as being provided to loudness estimator 10. However, such simplifications are simply for ease of discussion and/or illustration. It should be understood that in any of the embodiments of the present invention any combination or all of such inputs 7, 10 and 12 may be provided to and used by loudness estimator 10.

The following discussion generally refers to embodiments in which the original signal previously has been recorded, and input signal 7 has been generated by reading that previously recorded signal. However, it should be understood that these embodiments are merely exemplary, that no loss of generality is intended, and that the same concepts and terminology are intended to encompass situations where the original signal has been produced and then, e.g., transmitted or otherwise provided without any intermediate recording step. That is, each reference to "recording", "recorded" or other variations of the base word "record" herein are intended to encompass any manner in which the original signal has been a generated, produced and/or otherwise provided, irrespective of whether or not the signal actually has been recorded, and references to any form of the word "record" herein can be replaced with the corresponding form of the word "generate", "produce" or "provide". Also, a compensation system 5 according to the present invention may be inserted into any audio-signal processing chain where loudness compensation is desired, including, but not limited to, an audio mixing and/or production signal chain, as well as a playback system.

Figure 2:
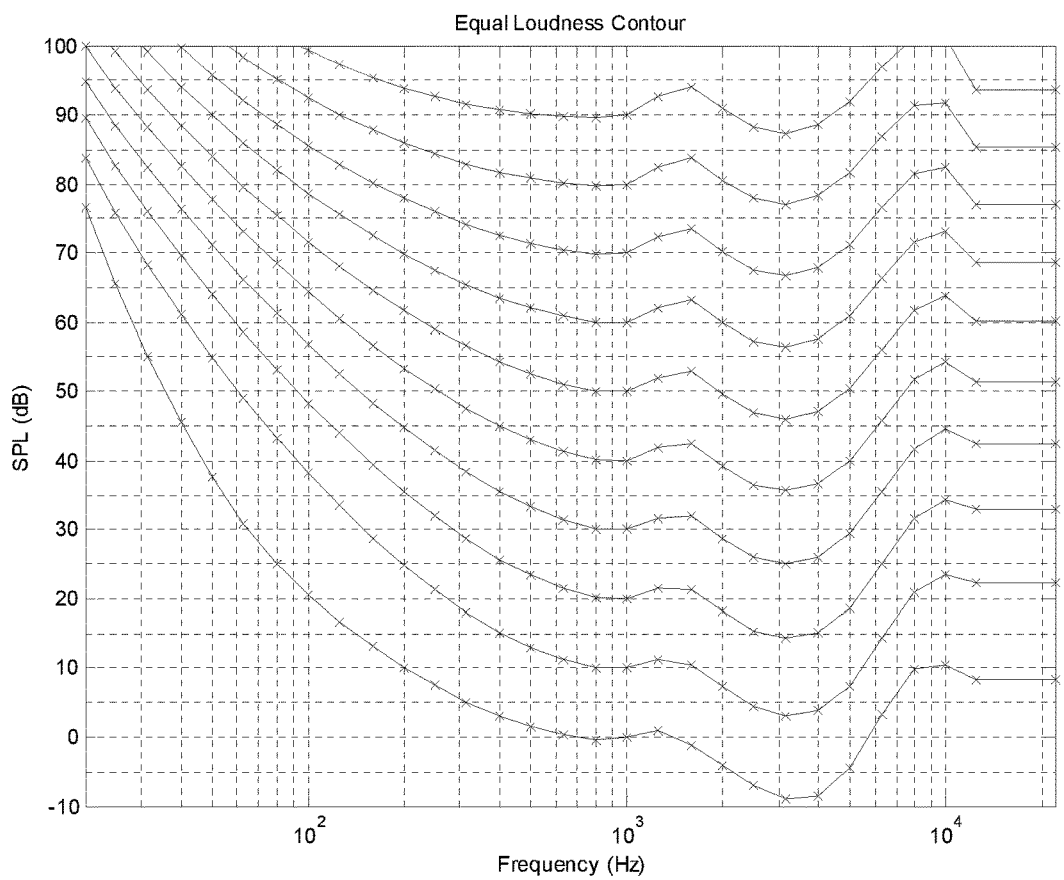
FIG. 2 illustrates equal-loudness contours for various volume levels according to ISO 226:2003.

Referring again to FIG. 1, the loudness estimates from module 10 are provided to filter generator/selector module 18, which generates a compensation filter 20, or retrieves a pre-stored filter 20, to use based on such estimates. In the preferred embodiments, the compensation filter 20 is generated or selected based on the equal-loudness contours of ISO 226: 2003. However, in alternate embodiments, other (e.g., similar) equal-loudness contours instead may be used and/or other techniques may be used. As is known in the art, an equal-loudness contour is a contour of sound pressure level (SPL), over the frequency spectrum, at which pure steady tones are perceived by people as being equally loud. In ISO 226: 2003, the SPL of a pure tone with a frequency of f denoted as L(f) in dB, is adjusted until it is perceived to be as loud as that of a reference tone at 1,000 hertz (Hz), whose SPL is denoted as R in dB. Consequently, the contour is usually labeled by R, the loudness of the reference tone, so an equal-loudness contour may be denoted by L(f;R). The value of R is also used as the measure for the loudness level, whose unit (dB) is also referred to as phon. Equal-loudness contours for various loudness levels according to ISO 226: 2003 are shown in FIG. 2.

If the loudness level of the reference tone is subtracted from the equal-loudness contour, we obtain the relative loudness attenuation contour, $A(f;R)=L(f;R)-R$ dB, which represents the attenuation applied to an input tone at frequency f by the loudness-perception mechanisms of the human auditory system. Given an input audio spectrum X(f), the signal perceived by people in terms of loudness is thus $Y(f)=X(f)-A(f;R)$ dB.

When a piece of audio content is produced (e.g., by an artist), a particular loudness level typically is set, which establishes the corresponding recording loudness level Rr, the recording equal-loudness contour Lr(f;Rr), and the recording relative loudness attenuation contour Ar(f;Rr). If Xr(f) denotes the frequency response of the original audio signal, the original signal perceived by the human ear in terms of loudness is $Yr(f)=Xr(f)-Ar(f;Rr)$ dB.

This is the signal that typically will have been optimized in terms of spectral balance during production (e.g., recording). The playback loudness, Rp, usually is different than the recording loudness for a variety of reasons, including the unavailability of the recording loudness level, different reproduction equipment, different acoustic environment, and/or a different preferred playback loudness level. Let Xp(f) denote the frequency response of the this ideal playback audio signal, which may be defined by a loudness difference from the original audio signal, as follows:

$Vd=Xr(f)-Xp(f)$ dB.

This different playback loudness establishes the corresponding playback loudness level Rp, the playback equal-loudness contour Lp(f;Rp), and the playback relative loudness attenuation contour Ap(f;Rp). Consequently, the playback signal, as perceived by people in terms of loudness, is $Yp(f)=Xp(f)-Ap(f;Rp)$ dB.

Because the relative loudness attenuation contours Ar(f;Rr) and Ap(f;Rp) are different, the perceived playback spectral balance or sound quality is different than the original (e.g., that intended by the artist or the sound engineer). In order to mitigate this problem, filter generator/selector module 18 preferably generates or selects a filter 20 that provides a loudness compensation contour, e.g., denoted by G(f;Rr,Rp), so that the perceived playback spectral balance is the same as the original, except for the loudness difference, i.e., $Yr(f)-[Yp(f)+G(f;Rr,Rp)]=Vd$ Substituting, the ideal loudness-compensation contour is $$G(f;Rr,Rp)=Ap(f;Rp)-Ar(f;Rr). \qquad \text{Equation 1}$$

Figure 3:
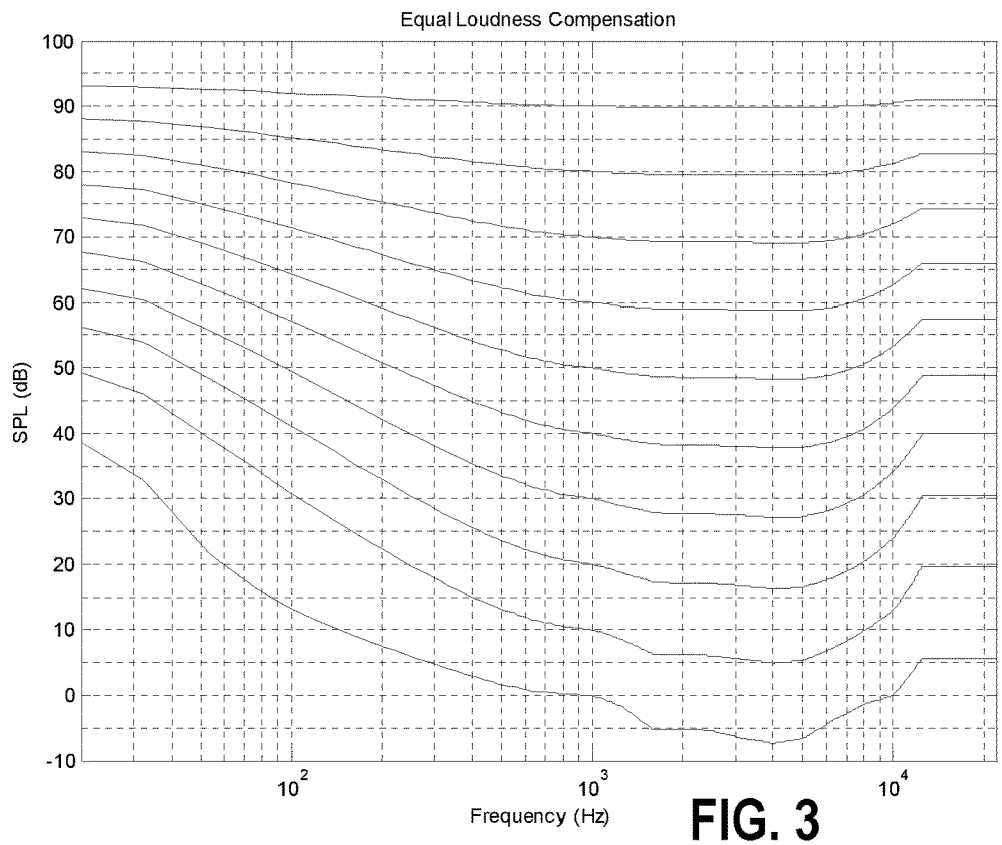
FIG. 3 illustrates certain exemplary loudness compensation contours.

FIG. 3 shows such loudness-compensation contours for Rr=96 dB and Rp=0, 10, . . . , 90 dB, respectively.

However, a potential problem with the foregoing ideal loudness-compensation contours is that the gain for bass may become very high, especially for low playback loudness levels. For example, the zero-phon contour in FIG. 3 exhibits a bass boost of almost 40 dB. Such a bass boost might cause speaker coils to hit back plates, leading to distortion and, possibly, speaker damage. Accordingly, in certain embodiments such bass boost is limited. In one embodiment, for example, a bass frequency $f_B$ is selected and the foregoing loudness compensation contour is modified such that $$G'(f;Rr,Rp)=\begin{cases} G(f_B;Rr,Rp) & \text{for } f<f_B \\ G(f;Rr,Rp) & \text{otherwise} \end{cases}. \qquad \text{Equation 2}$$

Figure 4:
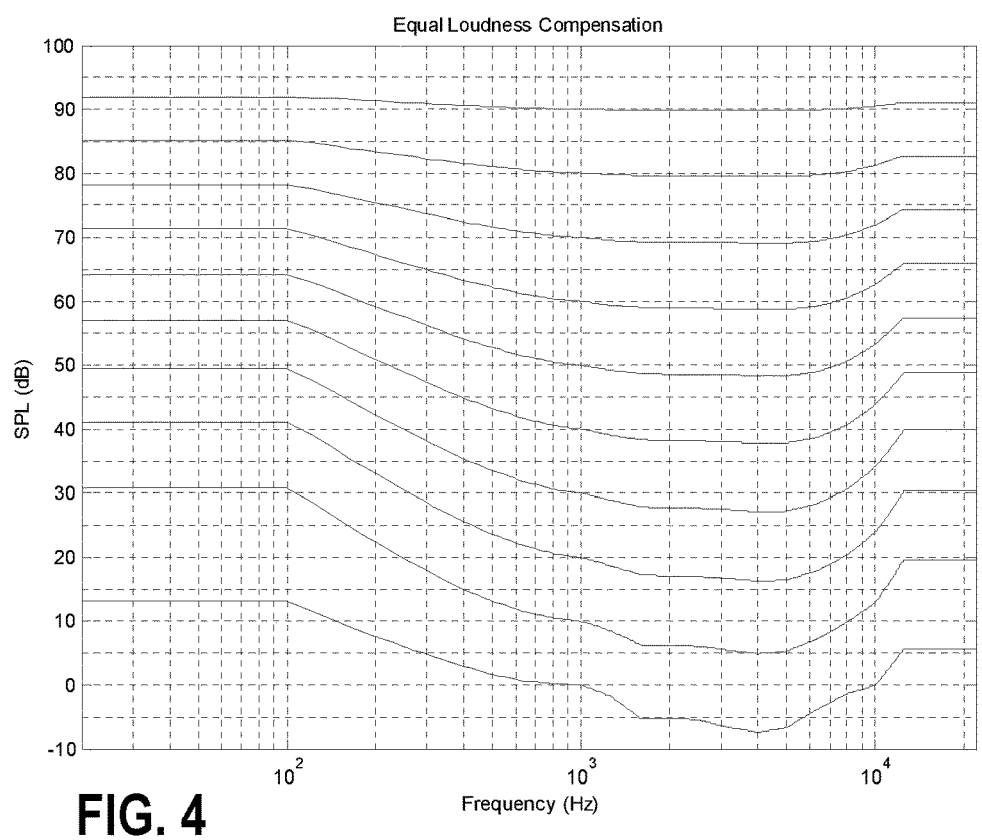
FIG. 4 illustrates certain modified exemplary loudness compensation contours in order to limit excessive bass gain.

FIG. 4 illustrates the loudness compensation contours of FIG. 3 with the foregoing modification and with $f_B$=100 Hz. However, it should be understood that other approaches to limiting excessive gain (especially low-frequency gain) instead may be used.

In the preferred embodiments, module 18 first synthesizes the desired compensation contour (e.g., as discussed above) based on a pre-stored set of equal-loudness contours and the loudness estimates received from module 10 and then generates the compensation filter 20 based on this desired compensation contour (e.g., as discussed in the section titled "Filter Generation Based on Volume Compensation Contour" below). More preferably, the foregoing steps are repeated by module 18 each time one of the loudness estimates received from module 10 changes.

As shown in FIG. 1, the input signal 7 is then processed by this currently selected/generated compensation filter 20 to provide an output signal 22, which typically is then amplified and used to drive one or more audio output devices 24, such as speakers or headphones. However, output signal 22 instead can be used for any other purpose.

Loudness Estimation.

The following are more-detailed descriptions of certain specific implementations of loudness estimator 10, or at least portions of it, each employing a different approach, as indicated by the corresponding subsection title.

User-Set Recording and Playback Loudness Levels

In this implementation, the user who is playing back the audio signal selects both the recording reference loudness level Rr and the playback loudness level Rp. The selection of the recording reference loudness level Rr may be an estimate of the average signal level when the audio content was produced. A value around −18 dBFS is widely used in the recording industry and, therefore, may be set by default, e.g., with the user/listener having the ability to modify the value in either direction, if desired. In this regard, for example, a user may wish to set the value very high, such as 0 dBFS, to give a strong impression of loudness enhancement, or in alternate embodiments, such a value instead may be used as the default. In any event, in the current embodiment the user can adjust this parameter before or during playback to suit his/her preference. The playback reference loudness level Rp, on the other hand, is purely a user parameter and typically will be selected to suit a user's preference as to how loudly the audio is to be played (e.g., by adjusting the volume control on the playback device).

It is noted that, with respect to each such parameter, it is not necessary for the user to be aware of the specific value that will be used within the compensation system 5 based on a particular setting made by the user. Instead, for example, the user might just select a value from −10 to +10 in relation to the recording reference loudness level Rr (e.g., with 0 corresponding to one of the default values noted above and with the maximum value in each direction corresponding to the maximum desired deviation from the default value) and also select a value from 0 to 10 for the playback loudness, e.g., with the system 5 then translating those selected settings into a corresponding recording reference loudness level Rr and a corresponding playback reference loudness level Rp. In fact, as noted above, depending upon the individual embodiment, the specific value that is to be used based on a particular user setting might also depend on other information 14 regarding the original audio signal production environment and/or the playback environment (e.g., with regard to the latter, headphone/speaker sensitivity, room acoustics, amplifier gains, etc.).

User-Set Recording Loudness Level and Variable Playback Loudness Level

Figure 5:
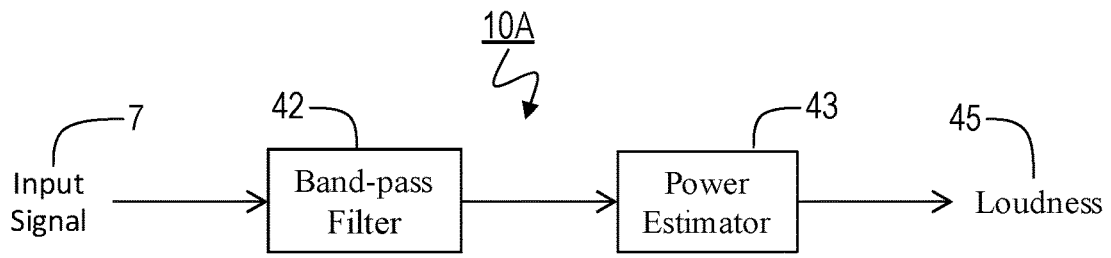
FIG. 5 is a block diagram of a playback reference loudness estimator in the time domain according to a representative embodiment of the present invention.

In this embodiment, the recording reference loudness level Rr is set to a fixed value (e.g., by default or based on a setting made by the user), as in the previous embodiment, but the playback reference loudness level Rp is estimated in real time from the input signal 7. One example of a playback reference loudness estimator 10A in the time domain is illustrated in FIG. 5. As shown, it includes a band-pass filter 42 and a power estimator 43. The center frequency of the band-pass filter 42 preferably is set to 1,000 Hz (in order to correspond to the reference tone used in the measurement of the equal-loudness contours upon which the compensation is to be based). Its bandwidth may be selected to be very narrow (e.g., not more than 500 Hz or 1,000 Hz, such as with a pass band that covers the two critical bands around 1000 Hz, typically from 800 to 1,250 Hz) to arrive at a good estimate of the power level around the reference tone. However, using a narrow bandwidth may produce a very low loudness during situations in which the instantaneous power around the reference tone is very low, such as when only bass guitar is present in the input audio signal. A wider bandwidth (e.g., 4,000-6,000 Hz, such as a pass band from 200 to 5,000 Hz) will alleviate this problem, but with the potential drawback that the estimated loudness might not accurately reflect the loudness level of the reference tone (e.g., 1,000 Hz). An extreme bandwidth selection may comprise the full audio bandwidth, in which case the band-pass filter 42 may be omitted entirely in order to save unnecessary computation. More generally, the approach for estimation of the playback loudness level Rp in the playback device preferably is identical to, or at least matches, the approach that was used, or is assumed to have been used, for estimating the recording (or other production) reference loudness level Rr.

A smoothing mechanism preferably is included in the power estimator 43 to ensure a loudness estimate that varies smoothly with time. One such embodiment uses the following sliding (or moving) average of calculated power values:

$$P(n) = \sum_{k=0}^{N-1} x^2(n-k)$$

where x(n) is the input sample value and N is the block size. A simpler embodiment is to use a low-order infinite-impulse-response (IIR) filter, such as the following first-order IIR lowpass filter:

$$P(n) = \alpha P(n-1) + (1-\alpha) x^2(n) \qquad \text{Equation 3}$$

where α is the filter coefficient and is related to sampling frequency $f_s$ and time constant τ as $$\alpha = e^{-\frac{1}{\tau f_s}}.$$

In any event, power estimator 43 outputs the (preferably smoothed) loudness estimate 45.

Figure 6:
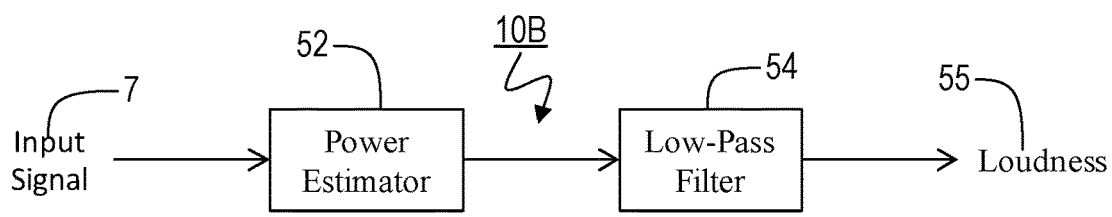
FIG. 6 is a block diagram of a playback reference loudness estimator in the frequency domain according to a representative embodiment of the present invention.

The playback reference loudness estimator instead may be implemented in the frequency domain, such as estimator 10B shown in FIG. 6. Let X (k) denote the DFT coefficients of the input signal, the power estimator 52 preferably calculates the power around the frequency of the reference tone (e.g., 1,000 Hz) as $$P = \frac{1}{K_H - K_L + 1} \sum_{k=K_L}^{K_H} |X(k)|^2,$$

where $K_L$ and $K_H$ are the DFT bins corresponding to frequencies around the reference tone.

The power value obtained above may vary significantly between successive DFT blocks due to the block processing nature of DFT, which in turn could otherwise result in abrupt changes in loudness compensation. This problem can be mitigated by a low-pass filter 54, such as the first-order IIR filter given in Equation 3 above.

in order to provide the loudness estimate 55.

Also, in a somewhat alternate variation of the foregoing embodiment, the recording reference loudness level Rr is set to a fixed value based on other information 14 (such as metadata included with the original signal upon which input signal 7), with or without the ability of the user to adjust this default value, and the playback reference loudness level Rp is estimated from the input signal 7 (e.g., as discussed above).

Variable Recording and Playback Reference Loudness Levels

The playback reference loudness level estimated from the input audio signal 7 using the structures, approaches and techniques described in the preceding two subsections could be used as the recording reference loudness level as well, if the recording and playback loudness levels were assumed to be the same. However, the playback and recording loudness levels are almost always different, and this difference may be accommodated by the loudness difference parameter $$\Delta p = Rr - Rp,$$

which preferably is set by the user. Then, once the playback reference loudness level is estimated from the input audio signal, the recording reference loudness level can be easily obtained as $$Rr = Rp + \Delta p.$$

Figure 7:
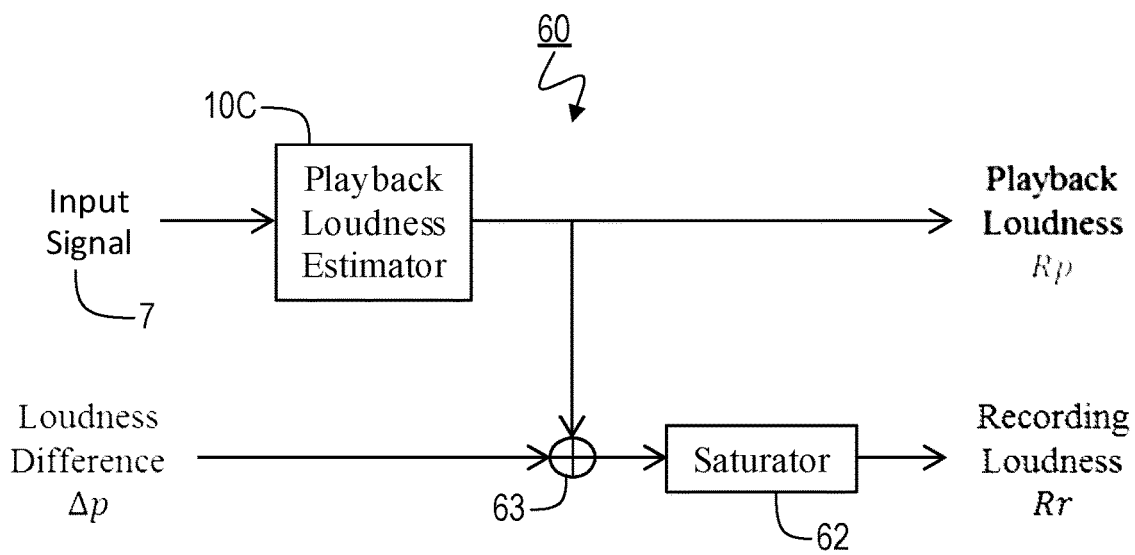
FIG. 7 is a block diagram for estimating playback reference loudness level and then, using a difference-based approach, estimating production (e.g., recording) reference loudness level.

A structure 60 for implementing such a difference-based approach is illustrated in FIG. 7, in which estimator 10C can be, e.g., either of estimators 10A or 10B. The saturator 62 at the output of adder 63 in FIG. 7 is used to ensure that the calculated recording reference loudness levels do not exceed a specified maximum, such as 0 dBFS.

Filter Generation Based on Loudness-Compensation Contour.

In the preferred embodiments of the invention, once the loudness-compensation contour has been retrieved or generated (e.g., as described above), module 18 generates a corresponding filter. The following discussion pertains to techniques for doing so that may be implemented by module 18.

Figure 8:
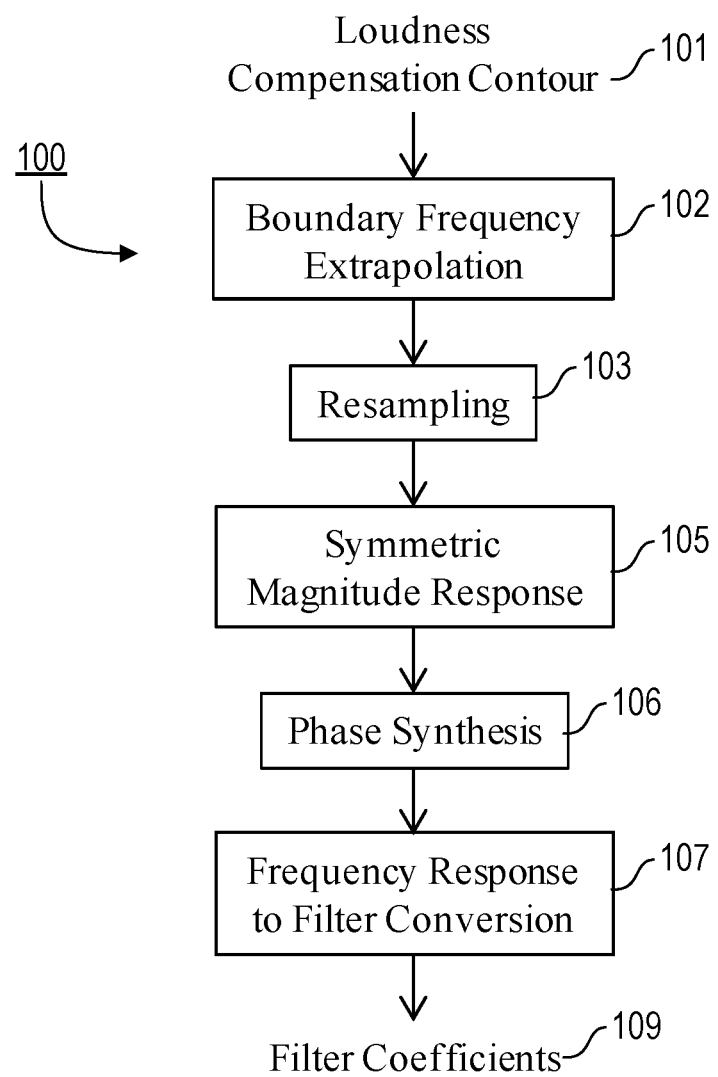
FIG. 8 is a flow diagram of a method for generating filter coefficients from a desired loudness-compensation contour.

The loudness-compensation contours given above (i.e., Equation 1 and Equation 2) are magnitude frequency responses at frequency grids where loudness data are available. The desired contour preferably is converted to a practical filter that can be used for loudness compensation. One such method 100 for processing a desired loudness-compensation contour 101 is illustrated in FIG. 8 and described below.

Initially, in step 102 the input loudness compensation contour is extrapolated to cover the zero and Nyquist frequencies when no equal-loudness data exist for such points (which is the typical case). A simple approach is to just copy the nearest available contour values to those frequencies. A somewhat more-involved approach is linear extrapolation, e.g., using the two contour data points corresponding to the lowest frequencies to build a linear equation to extrapolate the zero frequency and using the two contour data points corresponding to the highest frequencies to extrapolate the Nyquist frequency. Alternatively, higher-order extrapolation may be used in conjunction with additional data point(s).

Next, in step 103 the resulting loudness-compensation contour is resampled to a frequency grid that is appropriate for filter design. This step preferably provides a uniform frequency grid, which can be used in a fast Fourier transform (FFT). Linear interpolation is usually sufficient for this purpose, but more complicated methods, such as spline interpolation, instead may be used.

In step 105, the resulting loudness-compensation contour is reflected in the frequency range between zero and the Nyquist frequency around the Nyquist frequency to the frequency range between the Nyquist frequency and the sampling rate so as to build a symmetric magnitude response. Such a step ensures that the subsequent loudness-compensation filter has real coefficients only.

In step 106, phase is synthesized in order to convert the magnitude response into a proper frequency response. A simple approach is to attach zero phases to all frequency bins and then delay the impulse response of the subsequent filter to make it causal. Another approach is to obtain a minimum-phase frequency response from the magnitude response using a variety of methods such as the nonparametric approach based on complex cepstrum (e.g., as discussed in A. V. Oppenheim and R. W. Schafer, Digital Signal Processing, Englewood Cliffs, N.J.: Prentice-Hall, 1975). If an IIR filter is to be used, minimum-phase is preferred because it typically is either assumed by, or works best with, most algorithms for converting magnitude response to IIR filter coefficients.

In step 107, the resulting frequency response is converted to a filter suitable for real-time implementation, typically by generating filter coefficients 109. Either an IIR or a finite-impulse-response (FIR) filter may be used, and techniques for generating both are described below.

IIR Filter

If an IIR filter is desired, any suitable filter conversion methods may be used, such as the equation error method described in J. O. Smith III, "Introduction to Digital Filters: with Audio Applications", W3K Publishing, 2007. When the delay line of an IIR filter is hard-wired to its filter coefficients (which typically is the case), a change of filter coefficients ordinarily necessitates a different delay line. Therefore, such IIR filters are not preferred when the loudness-compensation contour varies with (or is expected to potentially vary with) time.

FIR Filter

For a given order, all FIR filters can share the same delay lines, so FIR filters better allow for dynamic update of the loudness-compensation contour. Because each update of the loudness-compensation contour entails calculation of a new set of FIR filter coefficients, simple and stable conversion methods are preferred. One such example is given below:

1. Apply inverse FFT to the loudness-compensation frequency response obtained in step 106 (in FIG. 8) to get its impulse response.

2. Apply a window function to the impulse response if a shorter filter is desired. The center of the window preferably is aligned with the center of energy of the impulse response.

3. If zero-phase was used in step 106, delay the impulse response to make it causal. Appropriate delaying is also desirable if windowing is used in the immediately preceding step 2.

The procedure above might be too computationally intensive if the filter is updated for each input sample. To mitigate this potential problem, a set of FIR filters may be pre-calculated as follows:

1. Quantize the desired dynamic range of the recording and playback loudness levels. To accommodate human loudness perception and to use a smaller set of quantization levels, a non-uniform quantization approach, such as logarithmic, preferably is used.

2. For each pair of the quantized recording and playback loudness levels, produce a loudness compensation filter.

3. Store the compensation filters in a filter table for later lookup.

Figure 9:
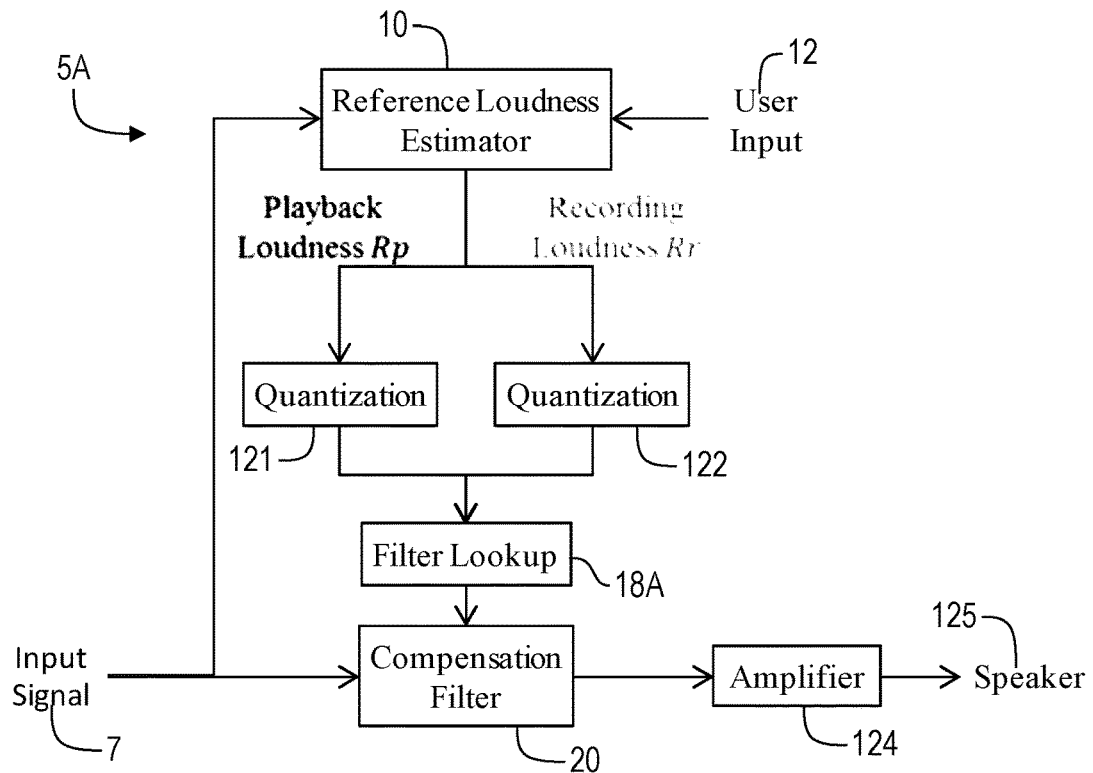
FIG. 9 is a block diagram illustrating a loudness-compensation playback system that utilizes pre-stored compensation filters.

A system 5A for then utilizing these stored compensation filters is illustrated in FIG. 9. Although not explicitly shown, other input(s) 14 also may be provided to the loudness estimator 10, as discussed above.

As shown and as also discussed above, estimator 10 generates estimates of the recording (or other production) reference loudness level Rr and the playback reference loudness level Rp. Then, in quantizers 121 and 122, respectively, these two estimates are quantized (e.g., using the same approach noted above in connection with generation of the pre-stored compensation filters). The quantized values are provided to filter lookup module 18A (e.g., as indices into a lookup table), and the matching filter 20 is selected for processing the input audio signal 7. In this particular embodiment, the output of filter 20 is first amplified in amplifier 124 and then used to drive one or more speakers 125.

STFT Implementation

Because each update of the compensation filter 20 entails the application of a different FIR filter, some degree of discontinuity in the filtered audio samples is likely to arise and may become audible. This discontinuity problem is mitigated in certain embodiments of the invention by introducing overlapping between the audio samples produced by adjacent filters. The overlapping-and-add operation inherent in short-time Fourier transform (STFT) suits this goal very well. Computational efficiency associated with FFT is another benefit of STFT. However, other techniques that imply overlapping instead may be used to provide the same or similar benefit.

Figure 10:
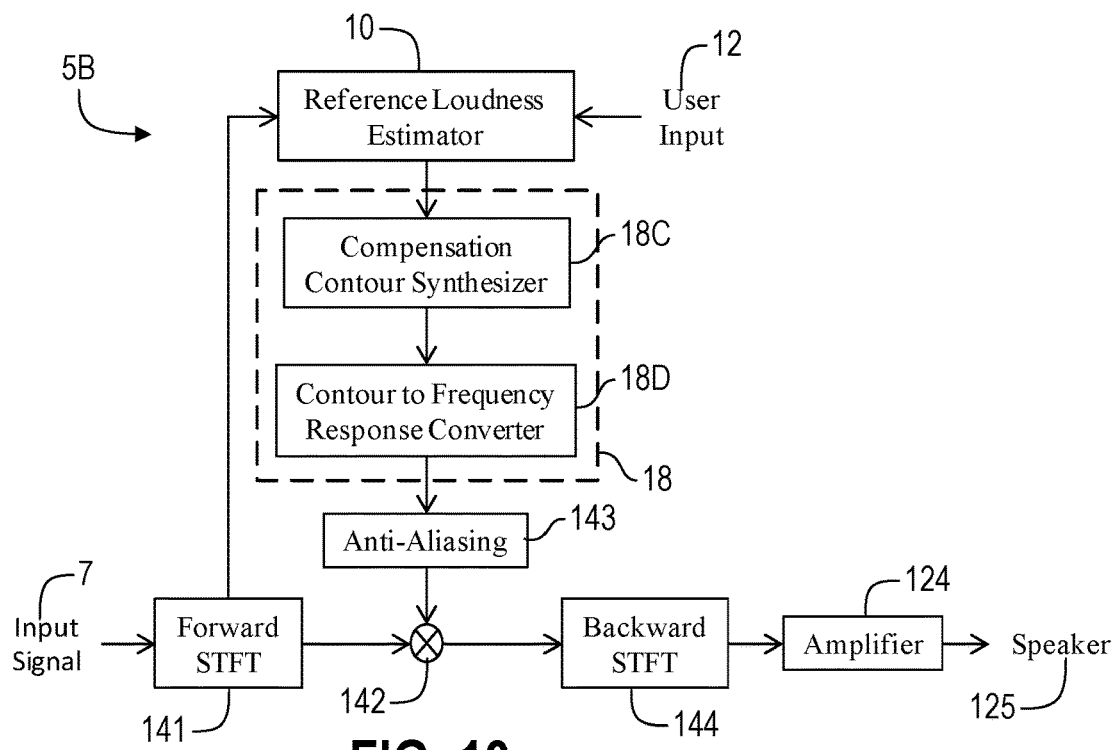
FIG. 10 is a block diagram of a playback system that utilizes short-time Fourier transform (STFT) loudness compensation.

One system 5B for implementing STFT loudness compensation is illustrated in FIG. 10. As discussed above, the generator/selector module 18 includes a compensation contour synthesizer 18C and a contour-to-frequency-response converter 18D. The Forward STFT module 141 transforms the input audio signal 7 (which initially is in the time domain) into the frequency domain so that the resulting frequency coefficients can be multiplied by the frequency response coefficients provided by module 18 in multiplier 142.

One characteristic of the present STFT-based approach is that the convolution for loudness compensation filtering in the time domain is replaced by multiplication in the frequency domain. While this approach typically improves computational efficiency, it may induce time-domain aliasing if the following size constraint is not satisfied $$ML+F<N \qquad \text{Equation 4}$$

where M is the block size of the STFT, L is the number of STFT blocks, N is the DFT size, and F is the number of FIR filter coefficients. For a given M L and N, the anti-aliasing module 143 enforces this constraint by converting the frequency response of the loudness compensation filter provided by module 18 into a frequency response having a corresponding impulse response with a length F that does in fact satisfy Equation 4.

Figure 11:
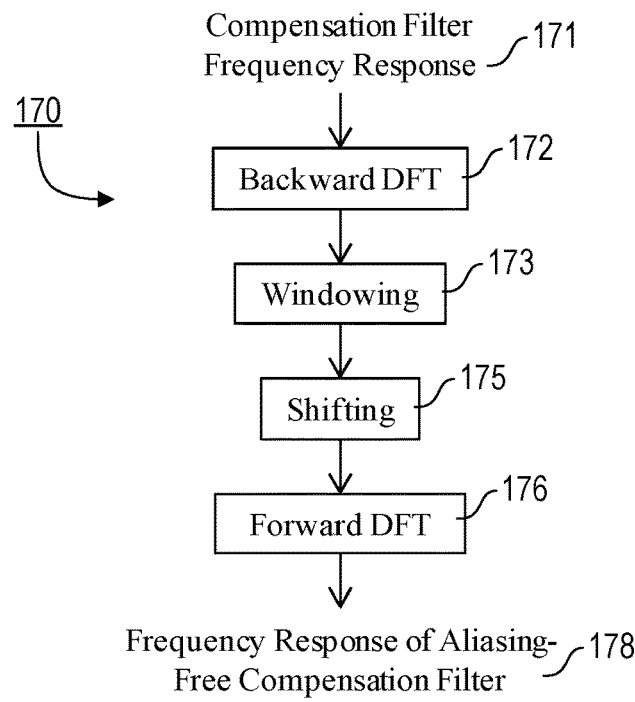
FIG. 11 is a flow diagram illustrating an anti-aliasing process.

According to one embodiment, the anti-aliasing module 143 implements the process steps of the method 170, which is illustrated in FIG. 11, on the frequency response 171 provided by module 18. Initially, in step 172 a backward DFT is applied to the frequency response 171 in order to obtain its impulse response. The size of this DFT may be shorter than the DFT size for STFT so as to reduce computation load for this DFT, as well as for the Contour to Frequency Response Converter 18.

In step 173, the impulse response obtained from step 172 preferably is multiplied by a window function of length F, such as a Hann or Blackman window, to ensure that the time-limit of the resulting impulse response satisfies Equation 4.

In step 175, the impulse response, after any modification pursuant to step 173, is shifted to achieve desired delay/phase characteristics. Because the filtering is performed in the frequency domain, a zero-phase filter is possible.

In step 176, a forward DFT is applied to the impulse response provided by step 175 in order to obtain its frequency response. This DFT preferably is of the same size as that of the STFT.

Similar to the discussion of the FIR filter in the previous section, if the procedure above is computationally too intensive, a set of compensation filter frequency responses may be pre-calculated, e.g., as follows:

1. Quantize the dynamic range for each of a set of possible recording and playback loudness levels. To accommodate human loudness perception and to use a smaller set of quantization levels, a non-uniform quantization approach, such as logarithmic, preferably is used.

2. For each pair of the quantized recording and playback loudness levels, generate a loudness-compensation filter frequency response.

3. Store the compensation filter frequency response in a table for later lookup.

Figure 12:
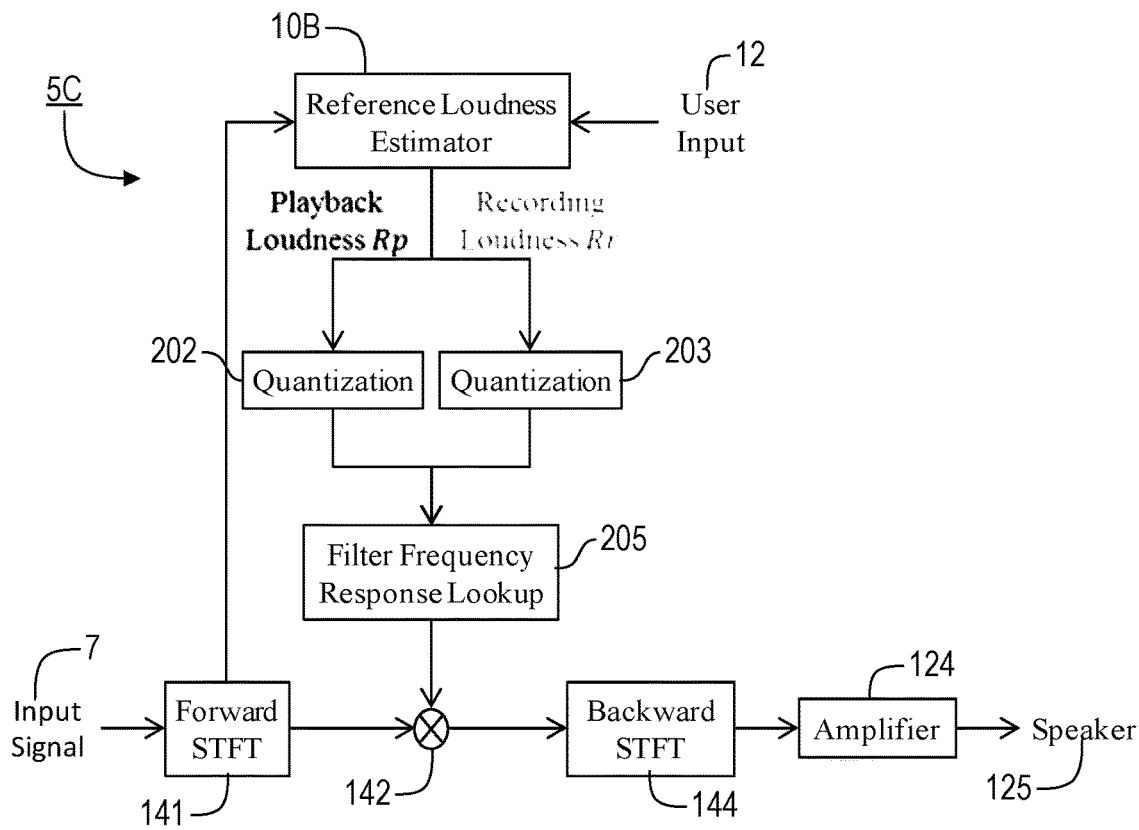
FIG. 12 is a block diagram of a playback system for performing STFT loudness compensation using pre-stored frequency responses.

A playback system 5C using such pre-stored filters is illustrated in FIG. 12. With reference to FIG. 12, upon each update of the recording and/or playback loudness estimates from estimator 10B, 1. The estimates for the playback loudness level Rp and the recording reference loudness level Rr are quantized within quantizers 202 and 203, respectively, using the same quantization approach used in generating the pre-stored filter responses (discussed above).

2. In frequency-response-lookup module 205, the resulting quantization indexes are used to look up a corresponding loudness compensation filter frequency response.

3. The frequency coefficients of the input signal 7 produced by forward STFT module 141 are multiplied by the filter frequency response retrieved in lookup module 205 (in multiplier 142), and then the backward STFT is performed in module 144, thereby providing the desired processing of the input samples 7.

It should be noted that although the specific example of STFT is used in the embodiments discussed above, other transformation approaches instead may be used. Accordingly, any and all references to STFT herein generally may be replaced with references to any frequency transformation or, for that matter, other orthogonal transformations.

Further Embodiments

In certain of the embodiments described above, the playback loudness level Rp is dynamically estimated from the input signal 7 in real time. Certain more-specific embodiments of this type also take into account other information, beyond the input signal 7 itself. In this regard, a focus solely on the input signal 7 might result in inappropriate compensation, e.g., due to variations in the actual loudness of the original recorded (or otherwise produced) signal (as opposed to its reference loudness). Generally speaking, an original recorded signal will exhibit a significant amount of variation in instantaneous loudness (e.g., to provide different auditory effects) within the context of an overall reference loudness setting. As a result, during playback the same variation in instantaneous loudness will occur, albeit at a different overall playback reference loudness setting. In certain preferred embodiments, particularly where one does not have access to the instantaneous recording loudness levels, the overall reference loudness levels (recording and playback) are estimated (e.g., across an entire piece of audio content). Then, in certain specific variations, the compensation contour is based solely on these levels. In other specific variations, the foregoing overall playback loudness level is modified by changes in the playback environment (such as playback loudness changes selected by the user, any change in the output device 24, particularly the sensitivity of such different output devices 24, and/or any changes in room acoustics, e.g., where the output device 24 includes one or more speakers). In still further specific variations, the overall estimated loudness levels (both recording and playback) are used to establish a difference loudness (e.g., $\Delta p$) and then this difference is used in a system such as system 60 (discussed above in connection with FIG. 7).

System Environment.

Generally speaking, except where clearly indicated otherwise, all of the systems, methods, functionality and techniques described herein can be practiced with the use of one or more programmable general-purpose computing devices. Such devices (e.g., including any of the electronic devices mentioned herein) typically will include, for example, at least some of the following components coupled to each other, e.g., via a common bus: (1) one or more central processing units (CPUs); (2) read-only memory (ROM); (3) random access memory (RAM); (4) other integrated or attached storage devices; (5) input/output software and circuitry for interfacing with other devices (e.g., using a hardwired connection, such as a serial port, a parallel port, a USB connection or a FireWire connection, or using a wireless protocol, such as radio-frequency identification (RFID), any other near-field communication (NFC) protocol, Bluetooth or a 802.11 protocol); (6) software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; (7) a display (such as a cathode ray tube display, a liquid crystal display, an organic light-emitting display, a polymeric light-emitting display or any other thin-film display); (8) other output devices (such as one or more speakers, a headphone set, a laser or other light projector and/or a printer); (9) one or more input devices (such as a mouse, one or more physical switches or variable controls, a touchpad, tablet, touch-sensitive display or other pointing device, a keyboard, a keypad, a microphone and/or a camera or scanner); (10) a mass storage unit (such as a hard disk drive or a solid-state drive); (11) a real-time clock; (12) a removable storage read/write device (such as a flash drive, any other portable drive that utilizes semiconductor memory, a magnetic disk, a magnetic tape, an opto-magnetic disk, an optical disk, or the like); and/or (13) a modem (e.g., for sending faxes or for connecting to the Internet or to any other computer network). In operation, the process steps to implement the above methods and functionality, to the extent performed by such a general-purpose computer, typically initially are stored in mass storage (e.g., a hard disk or solid-state drive), are downloaded into RAM, and then are executed by the CPU out of RAM. However, in some cases the process steps initially are stored in RAM or ROM and/or are directly executed out of mass storage.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, one or more server boxes, workstations, personal (e.g., desktop, laptop, tablet or slate) computers and/or even smaller computers, such as personal digital assistants (PDAs), wireless telephones (e.g., smartphones) or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these approaches, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality of this invention. Such media include, by way of example, magnetic disks, magnetic tape, optically readable media such as CDs and DVDs, or semiconductor memory such as various types of memory cards, USB flash memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server, server device, computer-readable medium or other storage device, client device, or any other kind of apparatus or device, such references should be understood as encompassing the use of plural such processors, computers, servers, server devices, computer-readable media or other storage devices, client devices, or any other such apparatuses or devices, except to the extent clearly indicated otherwise. For instance, a server generally can (and often will) be implemented using a single device or a cluster of server devices (either local or geographically dispersed), e.g., with appropriate load balancing. Similarly, a server device and a client device often will cooperate in executing the process steps of a complete method, e.g., with each such device having its own storage device(s) storing a portion of such process steps and its own processor(s) executing those process steps.

As used herein, the term "coupled", or any other form of the word, is intended to mean either directly connected or connected through one or more other elements or processing blocks. In the drawings and/or the discussions of them, where individual steps, modules or processing blocks are shown and/or discussed as being directly connected to each other, such connections should be understood as couplings, which may include additional elements and/or processing blocks.

ADDITIONAL CONSIDERATIONS

In the preceding discussion, the terms "operators", "operations", "functions" and similar terms can refer to method steps or hardware components, depending upon the particular implementation/embodiment.

Unless clearly indicated to the contrary, words such as "optimal", "optimize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing constraints.

In the above discussion, certain methods are explained by breaking them down into steps listed in a particular order. However, it should be noted that in each such case, except to the extent clearly indicated to the contrary or mandated by practical considerations (such as where the results from one step are necessary to perform another), the indicated order is not critical but, instead, that the described steps can be reordered and/or two or more of such steps can be performed concurrently.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multi-part criterion or condition).

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

In the discussions above, the words "include", "includes", "including", and all other forms of the word should not be understood as limiting, but rather any specific items following such words should be understood as being merely exemplary.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention are to be considered as within the scope thereof as limited solely by the claims appended hereto.

What is claimed is:

1. A system for loudness-based audio-signal compensation, comprising:
    (a) a first input that accepts an input audio signal;
    (b) a second input that accepts at least one control signal, representing an audio playback loudness level and a production loudness level for the input audio signal;
    (c) a filter generator/selector, coupled to the second input, that provides an audio compensation filter having a frequency response that is based on both the production loudness level and the audio playback loudness level,
    wherein the frequency response of the audio compensation filter changes over time based on corresponding changes in at least one of the production loudness level and the audio playback loudness level,
    wherein the input audio signal is processed by the audio compensation filter to provide an output signal, and
    wherein the loudness estimator provides the audio playback loudness level by first band-pass filtering an input signal to obtain a band-pass filtered signal and then estimating the audio playback loudness level from the band-pass filtered signal.

2. A system according to claim 1, wherein the output signal is coupled to an audio output device that comprises at least one of a speaker or a headphone.

3. A system according to claim 1, wherein the production loudness level is fixed based on a setting provided by a user.

4. A system according to claim 3, wherein the setting provided by the user is a selected deviation from a default value.

5. A system according to claim 1, wherein the audio playback loudness level is automatically re-estimated over time.

6. A system according to claim 5, wherein successive ones of said re-estimations are subjected to a smoothing process.

7. A system according to claim 1, further comprising a transform module for converting the input audio signal from a time domain into a frequency domain, and wherein the audio compensation filter processes the input audio signal in the frequency domain.

8. A system according to claim 7, further comprising an anti-aliasing filter that processes a preliminary frequency response provided by the filter generator/selector in order to inhibit time-domain aliasing that otherwise might occur in the frequency response of the audio compensation filter.

9. A system according to claim 8, wherein the anti-aliasing filter limits a length of an impulse response corresponding to said preliminary frequency response.

10. A system according to claim 9, wherein the anti-aliasing filter inverse transforms the preliminary frequency response into a time-domain signal, windows the time-domain signal, and then transforms the windowed time-domain signal back into the frequency domain.

11. A system according to claim 10, wherein the anti-aliasing filter shifts the windowed time-domain signal before transforming it back into the frequency domain.

12. A system according to claim 7, wherein the transform module performs a short-time Fourier transform (STFT).

13. A system according to claim 1, wherein the filter generator/selector generates the audio compensation filter by first generating a compensation frequency contour based on an equal-loudness contour for each of the audio playback loudness level and the production loudness level.

14. A system according to claim 13, wherein the equal-loudness contour for each of the audio playback loudness level and the production loudness level is based on ISO 226:2003 equal-loudness contours.

15. A system according to claim 13, wherein the compensation frequency contour includes a limitation of bass boost as compared to a contour based solely on the equal-loudness contours for the audio playback loudness level and the production loudness level.

16. A system according to claim 1, wherein the audio playback loudness level is determined based on a frequency band having a width of not more than 500 Hertz.

17. A system according to claim 1, wherein the audio playback loudness level is determined based on a frequency band having a width of 4,000-6,000 Hertz.

18. A system according to claim 1, wherein said at least one control signal includes a difference between the production loudness level and the playback loudness level.

19. A system according to claim 1, wherein the audio playback loudness level is set based on a setting of a volume control.

20. A system according to claim 1, wherein the audio playback loudness level is set based on sensitivity of an audio output device.

21. A system according to claim 1, wherein the audio playback loudness level is set based on amplifier gain.

22. A system according to claim 1, wherein the audio compensation filter is provided by reflecting a desired loudness-compensation contour, in a frequency range between zero and a Nyquist frequency, around the Nyquist frequency and then synthesizing phase, in order to generate a frequency response.

23. A system according to claim 22, wherein said frequency response is then converted to filter coefficients.

24. A system according to claim 1, wherein the audio compensation filter is provided by retrieving one of a plurality of pre-stored filters from a lookup table.

25. A system according to claim 1, wherein the audio playback loudness level is based on an input that reflects room acoustics.

26. A system according to claim 25, wherein the input that reflects the room acoustics is obtained by performing a calibration procedure in which a reference audio signal is played and then received through a microphone.

27. A system according to any of claim 1, wherein the audio playback loudness level is based on an input that is automatically detected based on information from an attached headphone.

28. A system according to claim 1, wherein the loudness estimator includes a saturator to ensure that the production loudness level does not exceed a specified maximum.

29. A system according to claim 1 for loudness-based audio-signal compensation, comprising:
(a) a first input that accepts an input audio signal;
(b) a second input that accepts at least one control signal, representing an audio playback loudness level and a production loudness level for the input audio signal;
(c) a filter generator/selector, coupled to the second input, that provides an audio compensation filter having a frequency response that is based on both the production loudness level and the audio playback loudness level,
wherein the frequency response of the audio compensation filter changes over time based on corresponding changes in at least one of the production loudness level and the audio playback loudness level,
wherein the input audio signal is processed by the audio compensation filter to provide an output signal, and
wherein when the audio compensation filter changes, audio samples produced by adjacent audio compensation filters are overlapped.

30. A system according to claim 1, wherein the production loudness level is an estimate of a level at which an original audio signal, corresponding to the input audio signal, was produced.

* * * * *

UNITED STATES PATENT AND TRADEMARK OFFICE
CERTIFICATE OF CORRECTION

PATENT NO. : 10,734,962 B2
APPLICATION NO. : 16/405712
DATED : August 4, 2020
INVENTOR(S) : Yuli You Page 1 of 1

It is certified that error appears in the above-identified patent and that said Letters Patent is hereby corrected as shown below:

In the Claims

Column 18, Claim 29, Lines 24-25, change "A system according to claim 1 for loudness-based audio-signal compensation, comprising:" to --A system for loudness-based audio-signal compensation, comprising:--.

Signed and Sealed this
Sixth Day of October, 2020

Andrei Iancu
*Director of the United States Patent and Trademark Office*